United States Patent [19]
Kleinberg

[11] Patent Number: 5,712,599
[45] Date of Patent: Jan. 27, 1998

[54] OSCILLATOR HAVING TWO CASCADED GAIN STAGES WITH FEEDBACK OPERATING NEAR THEIR UNITY GAIN FREQUENCY

[76] Inventor: Leonard L. Kleinberg, 7060 Hanover Pkwy., B-1, Greenbelt, Md. 20770

[21] Appl. No.: 665,954

[22] Filed: Jun. 19, 1996

[51] Int. Cl.⁶ .................. H03B 5/12; H03B 5/24
[52] U.S. Cl. .................. 331/108 B; 331/116 R; 331/117 R; 331/117 D; 331/135; 331/177 R
[58] Field of Search .................. 331/57, 108 R, 331/108 B, 115, 135, 136, 137, 177 R, 116 R, 117 R, 117 D

[56] References Cited

U.S. PATENT DOCUMENTS 3,641,369  2/1972  Wallingford .................. 331/108 R

FOREIGN PATENT DOCUMENTS 804472  11/1958  United Kingdom .................. 331/108 B

OTHER PUBLICATIONS

Neillen Technologies Corporation "Corporate Briefing", Apr. 1995, pp. 1, 2, 16, 17, and 20, Lauham, MD.
Neillen Technologies Corporation "Corporate Overview", pp. 1, 6, and 7, Apr. 1995, Lauham, MD.

*Primary Examiner*—Siegfried H. Grimm
*Attorney, Agent, or Firm*—Banner & Witcoff, Ltd.

[57] ABSTRACT

An oscillating signal generator for generating an oscillating signal having a variable oscillation frequency that can be near the unity gain frequency of the gain devices within the oscillating signal generator (Generation of High-Frequency Oscillating Signal Techniques, "GHOST"). Two gain stages, each with a respective effective resistance $R_{eff}$, an emitter load capacitance $C_E$, and a respective gain device having a unity gain frequency $\omega_T$, are cascaded and configured to provide a respective gain with a phase at substantially 180°. In that case, the oscillation frequency, of the oscillating signal generated by the oscillating signal generator of the present invention, $\omega = [\omega_T/(R_{eff}C_E)]^{1/2}$. A feedback with a feedback gain is provided between the output to the input of the cascade of the two gain stages. The feedback gain is designed such that a product of the feedback gain and the gain through the cascade of the two gain stages is substantially one. The oscillation frequency of the oscillating signal generated by the oscillator can be varied by a corresponding variation to $\omega_T$ and/or $R_{eff}$. Alternatively, the oscillation frequency can be substantially fixed at a predetermined resonance frequency determined by a frequency determining network operatively connected to the cascade of the two gain stages. The oscillating signal generator of the present invention which can generate sine waves can be implemented with circuit elements that are easily fabricated on-chip within a monolithic integrated circuit. In addition, because oscillation frequencies near the unity gain frequency of the gain devices can be achieved, higher frequencies for a given power dissipation or lower power dissipation for a given frequency can be obtained.

29 Claims, 5 Drawing Sheets

OSCILLATOR HAVING TWO CASCADED GAIN STAGES WITH FEEDBACK OPERATING NEAR THEIR UNITY GAIN FREQUENCY

FIELD OF THE INVENTION

The present invention relates generally to electronic circuits and more particularly to a method and apparatus for generating an oscillating signal having an oscillation frequency that is variable.

BACKGROUND

Typical variable frequency oscillators of the prior art for generating sine waves require the use of inductors. An example of such a prior art oscillator is a Colpitts oscillator with a varactor that varies a capacitance that in turn varies the frequency of the generated sine wave. The Colpitts oscillator also typically requires an inductor as a load of an active device.

Unfortunately, inductors are difficult to fabricate on-chip within a monolithic integrated circuit. Thus, oscillators of the prior art incorporate an inductor off-chip. Assembling an off-chip inductor adds cost for an extra inductor component and for the additional labor necessary to assemble the added inductor component to the integrated circuit. Also, implementation of an accurately controlled varactor in the Colpitts oscillator can be costly.

Alternatively, oscillators may take the form of an astable multivibrator or a ring oscillator. Although an astable multivibrator can be implemented without the use of an inductor, that an arrangement typically does not generate sinusoidal oscillating signals. The ring oscillator can generate sinusoidal oscillating signals, but its frequency can be difficult to control, and it consumes relatively high power.

OBJECTS OF THE INVENTION

An object of the present invention is to implement a variable frequency sine wave oscillator without inductors using circuit elements that can be easily fabricated on-chip within a monolithic integrated circuit.

A further object of the present invention is to implement a variable frequency sine wave oscillator that can operate at frequencies near the unity gain frequency of the gain devices within that oscillator such that higher frequencies for a given power dissipation and lower power dissipation for a given frequency can be obtained.

A related object of the present invention is to vary the oscillation frequency of the oscillating signal generated by such an oscillator by correspondingly varying the bias conditions of the gain devices within the oscillator.

Another related object of the present invention is to vary the oscillation frequency by correspondingly varying resistive values of resistors coupled to the gain devices within the oscillator.

An even further object of the present invention is to generate an oscillating signal with a predetermined resonance frequency determined by a frequency determining network coupled to the oscillator.

A related object of the present invention is to adjust the oscillation frequency with deviations from that predetermined resonance frequency.

SUMMARY

In a principle aspect, the present invention takes the form of a method and apparatus for generating an oscillating signal having an oscillation frequency that varies with at least one of a control signal and a resistive value. In accordance with the invention, each of two gain stages provides a gain and a phase of substantially 180° when a real component of a respective impedance at the input terminal of each gain stage is canceled out substantially to zero. This condition leads to an oscillation frequency that is directly proportional to a unity gain frequency of a respective gain device in each of the two gain stages and indirectly proportional to a resistive value of a respective effective resistor in each of the two gain stages.

Oscillation is thus achieved by cascading the two gain stages for a total phase of 360° and by feeding back the output of a latter of the two cascaded gain stages to the input of the former of the two cascaded gain stages. The feedback has a feedback gain such that a product of the gains through the two stages and the feedback gain is substantially one.

The gain devices may advantageously take the form of a Bipolar Junction Transistor (BJT) having a unity gain frequency for the BJT current gain frequency characteristic that is responsive to the control signal. The effective resistor for each gain stage would be operatively connected between an input to the gain stage and a base terminal of the respective BJT of the gain stage.

The principles of the present invention may be applied to particular advantage when the respective unity gain frequency of the two stages are substantially equal and when the respective effective resistors of the two stages have resistances that are substantially equal. In that case, the oscillation frequency of the oscillator of the present invention can be determined by that same unity gain frequency and resistance.

In a further aspect of the present invention, the resistance value of the effective resistor in each of the two stages of the oscillator is varied by a resistance control signal in order to correspondingly vary the oscillation frequency.

That embodiment of the present invention may be applied to particular advantage when the effective resistor in each of the two stages includes a respective diode. That diode would generate a resistance determined by a current flowing through the diode. That current is responsive to the resistance control signal. In turn, the oscillation frequency of the oscillator of the present invention can be varied by varying the resistance generated by the diodes.

In another aspect of the present invention, the oscillation frequency is set to a predetermined resonance frequency by operatively connecting a frequency determining network to the input of the first gain stage of the cascaded two gain stages. The control signal can be set to a predetermined level, such that the oscillator of the present invention is substantially a single-frequency oscillator. Alternatively, the control signal can be varied to generate a deviation from the predetermined resonance frequency for the oscillation frequency.

These and other features and advantages of the present invention will be better understood by considering the following detailed description of the invention which is presented with the attached drawings.

DETAILED DESCRIPTION OF THE PREFERRED EMBODIMENT

Figure 1:
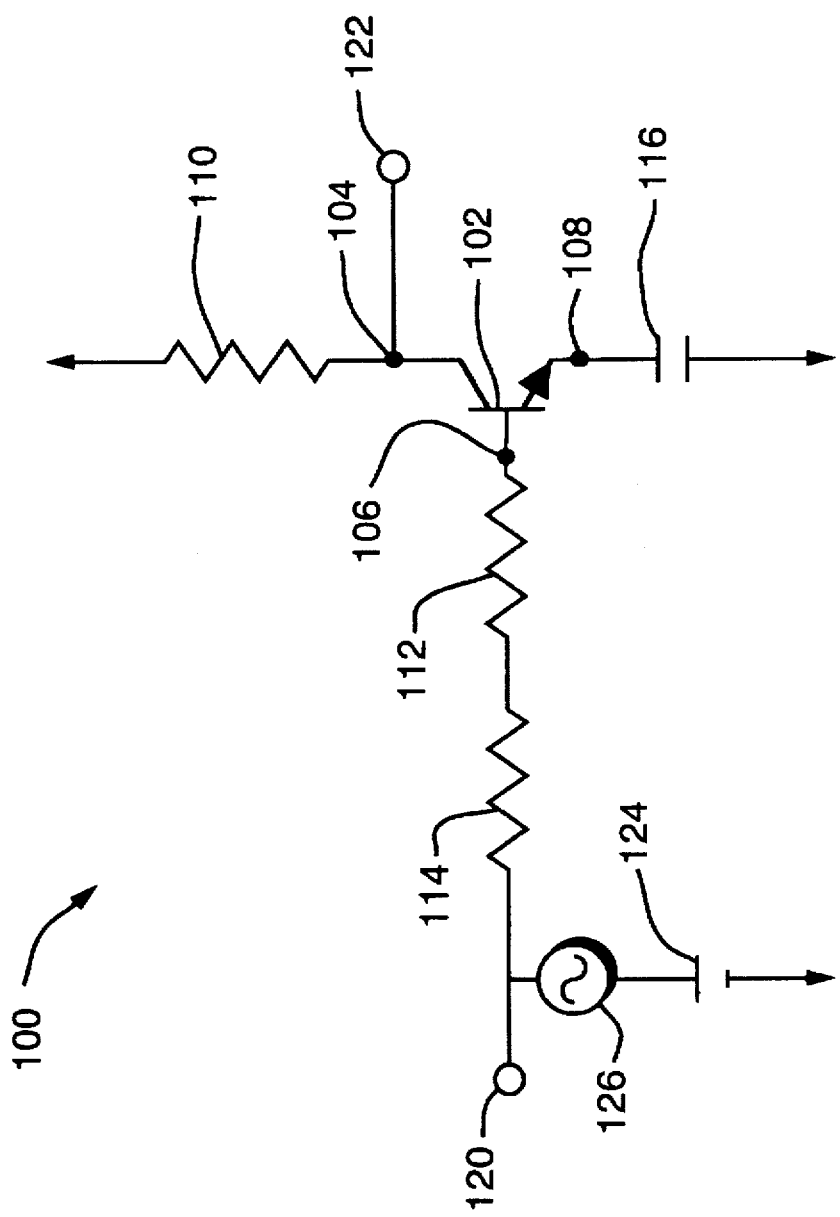
FIG. 1 illustrates a transistor implementation for each gain stage and the oscillation conditions of that gain stage for incorporation in the oscillator of the present invention.

FIG. 1 illustrates the typical oscillation conditions of a gain stage 100 incorporated into the oscillating signal generator of the present invention. That gain stage includes a BJT 102 having a collector terminal 104, a base terminal 106, and an emitter terminal 108. A collector load resistor 110 is operatively connected to the collector terminal, a base internal resistor 112 and a base load resistor 114 are operatively connected to the base terminal, and an emitter load capacitor 116 is operatively connected to the emitter terminal.

A stage input terminal 120 is operatively connected to the base load resistor 114, and a stage output terminal 122 is the collector terminal 104. A DC source 124 is operatively connected to the stage input terminal for determining a DC operating current component flowing through the BJT 102. In addition, a small signal variable source 126 is also operatively connected to the stage input terminal for generating a variable current component flowing through the BJT.

The oscillation conditions of the gain stage 100 for use within an oscillating signal generator is now described. For high frequencies, the BJT 102 has a beta ($\beta$) current gain characteristic that varies with frequency, as $\beta=(-j\omega_T)/\omega$, where $\omega$ is the frequency in radians per second and $\omega_T$ is the unity gain frequency of the $\beta$-characteristic. When $\omega=\omega_T$, the magnitude of the $\beta$-gain is unity. The unity gain frequency $\omega_T$ varies with a component current which includes a DC current, determined by the DC source 124, and a small signal current $i_s$, determined by the small signal source 126, flowing through the BJT, as $\omega_T=\omega^o+2\pi k i_s$. k is a slope constant that depends on the fabrication design parameters of the BJT. $\omega_o$ is the initial unity-gain frequency and is directly proportional to the DC operating current flowing through the BJT. An example BJT that has these characteristics and that can be used to implement the present invention is the MRF941 from Motorola, Inc., Schaumberg, Ill.

An effective impedance $Z_b$ looking into the base terminal 106 can be expressed as, $Z_b=(1+\beta)Z_e$, where $Z_e$ is the effective impedance at the emitter terminal 108. In this case, $Z_e=1/(j\omega C_E)$, where $C_E$ is the capacitance of the emitter load capacitor 116. Since $\beta=(-j\omega_T)/\omega$, $Z_b=[1+(-j\omega_T)/\omega][1/(j\omega C_E)]$.

An effective impedance $Z_{in}$ looking into the stage input terminal 120 includes a base effective resistor $R_{eff}$ in series with the effective impedance $Z_b$ looking into the base terminal 106 and a base-emitter junction capacitance reflected at the base terminal $C_e=1/(\omega_T r_e)$, where $r_e$ is the base-emitter junction resistance. $R_{eff}$ includes the base internal resistor 112 having a resistance value $r_b$ and the base load resistor 114 having a resistance value $R_B$, and thus, $R_{eff}=r_b+R_B$. The effective impedance $Z_{in}$ then has the following expression:

$Z_{in}=R_{eff}+Z_b+1/(j\omega C_e)$ $=R_{eff}-\omega_T/(\omega^2 C_E)+1/(j\omega C_E)+1/(j\omega C_e)$ With that effective input impedance, if an input voltage $V_{in}$ were to be applied at the stage input terminal 120, a base current $i_b$ in the base terminal 106 would result as follows:

$i_b=V_{in}/Z_{in}=V_{in}/[R_{eff}-\omega_T/(\omega^2 C_E)+1/(j\omega C_E)+1/(j\omega C_e)]$ The collector current $i_c=\beta i_b$ can be expressed as follows:

$i_c=V_{in}[(-j\omega_T)/\omega]/[R_{eff}-\omega_T/(\omega^2 C_e)+1/(j\omega C_E)+1/(j\omega C_e)]$ The output voltage $V_o$ at the stage output terminal 122 is the negative of the collector current $i_c$ times a resistance value $R_L$ of the collector load resistor 110 as follows:

$V_o=-i_c R_L=-V_{in}R_L[(-j\omega_T)/\omega]/[R_{eff}-\omega_T/(\omega^2 C_E)+1/(j\omega C_E)+1/(j\omega C_e)]$ Thus, the gain of the gain stage 100, $V_o/V_{in}=-R_L[(-j\omega_T)/\omega]/[R_{eff}-\omega_T/(\omega^2 C_E)+1/(j\omega C_E)+1/(j\omega C_e)]$ In the design of an oscillator, a total gain in an amplifier having a phase of 360° is typically required. If the gain stage 100 were designed to provide a phase of 180°, then a cascade of two such gain stages would provide the 360° phase. In order to achieve a 180° phase in the gain $V_o/V_{in}$ expressed above, the real effective component, $R_{eff}-\omega_T/(\omega^2 C_E)$, can be canceled substantially to zero as follows:

$R_{eff}-\omega_T/(\omega^2 C_E)=0$

This relation is an oscillation condition and would lead to the following relation for the oscillation frequency $\omega$:

$\omega^2=\omega_T/(R_{eff}C_E)$

Note that with the real effective component $R_{eff}-\omega_T/(\omega^2 C_E)$ canceled out substantially to zero, the gain $V_o/V_{in}=R_L[(j\omega_T)/\omega]*[1/(j\omega C_E)+1/(j\omega C_e)]=-\omega_T R_L C_{eff}$ where $C_{eff}=C_E C_e/(C_E+C_e)$. That gain as a negative real number provides the 180° phase. Also, since the real effective component has been canceled out substantially to zero, the remaining effective impedance at the stage input terminal 120 is purely capacitive, and $Z_{in}=1/(j\omega C_{eff})$ in that case.

Figure 2:
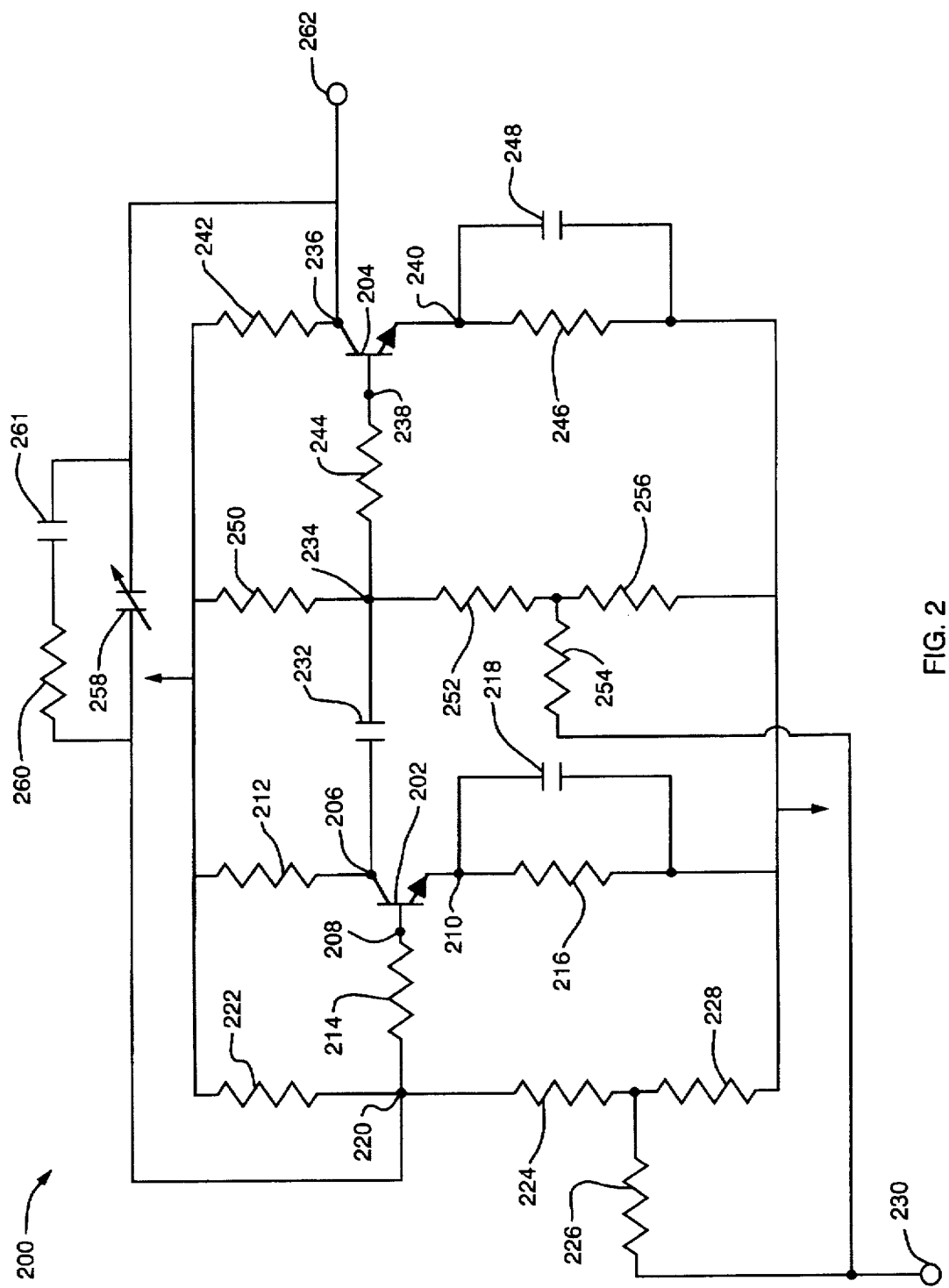
FIG. 2 shows an oscillator incorporating two stages of the gain stage of FIG. 1.

An oscillator typically requires an amplifier with a total phase of 360°. FIG. 2 shows an oscillating signal generator 200 having a cascade of two of the gain stages of FIG. 1. That oscillating signal generator includes a cascade of a first gain stage with a first BJT 202 as first gain device configured similarly to that of FIG. 1 to provide a first gain with a first phase of 180° and of a second gain stage with a second BJT 204 as a second gain device configured similarly to that of FIG. 1 to provide a second gain with a second phase of 180°.

The first gain stage includes the first BJT 202 having a first collector terminal 206, a first base terminal 208, and a first emitter terminal 210. This gain stage, being configured similarly to that of FIG. 1, also includes a first collector load resistor 212, a first base load resistor 214, a first emitter load resistor 216, and a first emitter load capacitor 218. A first stage input terminal 220 is operatively connected to the side opposite the first base terminal of the first base load resistor. A first base bias resistor 222 and a second base bias resistor 224 determine the DC operating voltage at the first stage input terminal and in turn the DC operating current flowing through the first BJT 202.

A first control signal bias resistor 226 and a second control signal bias resistor 228 operatively couple a control signal at a control signal terminal 230 to the first stage input terminal 220. A first stage output terminal is the first collector terminal 206 of the first BJT 202. A coupling capacitor 232 couples the output of the first stage at the first stage output terminal to a second stage input terminal 234 of the second gain stage.

The second gain stage includes the second BJT 204 having a second collector terminal 236, a second base terminal 238, and a second emitter terminal 240. This gain stage, also being configured similarly to that of FIG. 1, includes a second collector load resistor 242, a second base load resistor 244, a second emitter load resistor 246, and a second emitter load capacitor 248. The second stage input terminal 234 is operatively connected to the side opposite the second base terminal of the second base load resistor. A third base bias resistor 250 and a fourth base bias resistor 252 determine the DC operating voltage at the second stage input terminal and in turn the DC operating current flowing through the second BJT.

A third control signal bias resistor 254 an a fourth control signal bias resistor 256 operatively couple the control signal at the control signal terminal 230 to the second stage input terminal 234. A second stage output terminal is the second collector terminal 236 of the second BJT 204. A feedback network, including a feedback variable capacitor 258, a feedback resistor 260, and a feedback coupling capacitor 261 are operatively connected from the second stage output terminal to the first stage input terminal 220. The oscillator output terminal 262 is the second stage output terminal.

The operation of the oscillating signal generator 200 is now described. If the first emitter load resistor 216 has a resistive value $R_{E1}$ and the first emitter load capacitor 218 has a capacitance $C_1$, and if $R_{E1}$ and $C_1$ are substantially large such that $R_{E1} \gg 1/(j\omega C_1)$, then the capacitive reactance dominates in the parallel connection of the first emitter load resistor and the first emitter load capacitor, and the effective emitter load impedance for the first BJT 202 can be assumed to be $1/(j\omega C_1)$ similarly to the emitter load impedance for the gain stage of FIG. 1.

Similarly, if the second emitter load resistor 246 has a resistive value $R_{E2}$ and the second emitter load capacitor 248 has a capacitance $C_2$, and if $R_{E2}$ and $C_2$ are substantially large such that $R_{E2} \gg 1/(j\omega C_2)$, then the capacitive reactance dominates in the parallel connection of the second emitter load resistor and the second emitter load capacitor, and the effective emitter load impedance for the second BJT 204 can be assumed to be $1/(j\omega C_2)$ similarly to the emitter load impedance for the gain stage of FIG. 1.

The respective base internal resistance at the respective base terminal of the first and second BJTs are not shown in the gain stages of FIG. 2, but the respective base load resistor of those BJTs can be assumed to incorporate the respective base internal resistance. Similarly, the respective base-emitter junction capacitance at the respective base terminal of the first and second BJTs are not shown in FIG. 2, but the $C_{ef}$ of each stage can be can be assumed to incorporate the respective base-emitter junction capacitance.

If the first and second BJTs are similar, then they have a current gain frequency characteristic $\beta=(-j\omega_T)/\omega$, where $\omega_T$ is the unity gain frequency, and where $\omega_T=\omega_o+2\pi ki_e$ is dependent on the current flowing though those BJTs. Since the first and second gain stages of FIG. 2 are configured similarly to the gain stage of FIG. 1, these gain stages provide a first gain with a first phase of 180°, and a second gain with a second phase of 180° respectively. Because the respective real number component of the respective effective impedance at the first and second stage input terminals 220 and 234 has been canceled substantially to zero, ω, the oscillation frequency of the oscillating signal generated at the oscillator output terminal 262 has the following relation:

$$\omega^2=\omega_T/(R_{ef}C_E),$$

where $\omega_T$ is the unity gain frequency of the first and second BJTs. $R_{ef}$ is the effective resistive value of an effective resistor operatively connected between a stage input terminal and the base terminal and which includes the base internal resistance of a BJT. $C_E$ is the capacitance value of one of the first emitter load capacitor 218 and the second emitter load capacitor 248.

In the oscillating signal generator 200 of FIG. 2, the resistive values $R_1$ and $R_2$ of the first base load resistor 214 and the second base load resistor 244 respectively are substantially equal. Likewise, the capacitances $C_1$ and $C_2$ of the first emitter load capacitor 218 and the second emitter load capacitor 248 respectively are substantially equal. In that case, in the expression for the oscillation frequency, $\omega^2=\omega_T/(R_{ef}C_E)$, $R_{ef}$ would be that similar resistive value with the incorporation of the base internal resistance of one of the first and second BJTs. $C_E$ would be that similar capacitance.

With the respective real component of the respective effective impedance at the first and second stage input terminals 220 and 234 canceled substantially to zero, each of the first and second gain stages in FIG. 2 provides a respective gain with a respective phase of 180°. The cascade of these two stages provides a total phase of 360° at the oscillator output terminal 262.

To meet another typical requirement for oscillation, the output at the second stage output terminal 236 is fed-back to the first stage input terminal 220 via the feedback network including the feedback variable capacitor 258, the feedback resistor 260, and the feedback coupling capacitor 261. To meet the typical requirement for oscillation, the feedback gain introduced by the feedback network must be designed such that a product of the feedback gain and the first gain generated by the first gain stage and the second gain generated by the second gain stage is equal to substantially one.

With the oscillation condition of the respective component of the respective effective impedance at the first stage input terminal 220 being canceled substantially to zero, the effective impedance at that terminal is purely capacitive and $Z_{in}=1/(j\omega C_{ef})$. In that case, the feedback variable capacitor 258 introduces a capacitive divider feedback gain. That feedback gain $K_{fb}$ then is as follows:

$$K_{fb}=C_f/(C_f+C_{ef}),$$

where $C_f$ is the capacitance of the feedback variable capacitor.

If $K_{VG}$ is the total gain through the cascade of the first and second gain stages, a typical requirement for oscillation is that $K_{fb}K_{VG}=1$, or in the oscillating signal generator 200 of FIG. 2, that $C_f/(C_f+C_{ef})=1/K_{VG}$. The capacitance $C_f$ of the feedback variable capacitor 258 can be adjusted to meet that oscillation condition. Alternatively, in case that condition is not met, the feedback resistor 260 with the feedback coupling capacitor 261 still provides positive feedback to ensure that oscillation will occur.

With these oscillation conditions, the oscillating signal generator 200 of FIG. 2 will oscillate and produce a sine wave signal with an oscillation frequency to $\omega=[\omega_T/(R_{ef}C_E)]^{1/2}$. Note that the oscillation frequency is directly proportional to the unity gain frequency $\omega_T$ and indirectly proportional to $R_{ef}$.

The $\omega_T$ of a BJT is directly proportional to the current flowing through the BJT. In the oscillating signal generator 200, a control signal at the control signal terminal 230 determines the voltage at the first and second base terminals 208 and 238 which in turn determines the current flowing through the first and second BJTs 202 and 204 respectively. By thus varying the current flowing through the first and second BJTs, the control signal determines the $\omega_T$ of the BJTs and thus also the oscillation frequency to $\omega=[\omega_T/(R_{ef}C_E)]^{1/2}$.

The control signal can be a variable voltage, and a variation in the voltage would generate a corresponding variation in the oscillation frequency. In that case, the oscillating signal generator 200 is a Voltage Controlled Oscillator (VCO). This VCO that can generate variable frequency sine waves can be implemented with circuit elements such as transistors, capacitors, and resistors that are easily fabricated on-chip within a monolithic integrated circuit.

The VCO 200 of the present invention does not use any inductors whereas sine wave oscillators of the prior art typically require inductors. Since inductors cannot be readily fabricated on-chip, the VCO of the present invention can be less costly to implement since the added component of an off-chip inductor and the added labor needed to assemble that added component may not be necessary in the present invention.

Additionally, the oscillating signal generator 200 of FIG. 2 is advantageous for generating higher frequency sine waves for a given power dissipation. The VCO implementation of FIG. 2 allows the oscillator to operate close to the $\omega_T$ of the BJTs. Frequencies as high as ⅓ or ¼ of $\omega_T$ can be achieved with the present invention, whereas in the typical sine wave generator of the prior art, frequencies as high as 1/10 of $\omega_T$ are common. Since the oscillator of the present invention can operate close to the $\omega_T$ of the gain devices within the oscillator, for any given current (and thus power dissipation) that determines $\omega_T$, higher frequencies can be achieved. Thus, the oscillating signal generator of the present is especially amenable to high frequency communications applications. Frequencies as high as 2 GHz can be achieved with BJTs operating with unity gain frequencies of approximately 6 GHz whereas, a conventional 2 GHz oscillator typically may require a $\omega_T$=20 GHz. Conversely, any given frequency can be achieved with lower power dissipation.

In the VCO 200 of FIG. 2, the control signal at the control terminal 230 only varies the $\omega_T$ of the first and second BJTs 202 and 204 in generating a corresponding variation in the oscillation frequency $\omega=[\omega_T/(R_{eff}C_E)]^{1/2}$. $R_{eff}$ and $C_E$ are kept substantially constant in that circuit.

Figure 3:
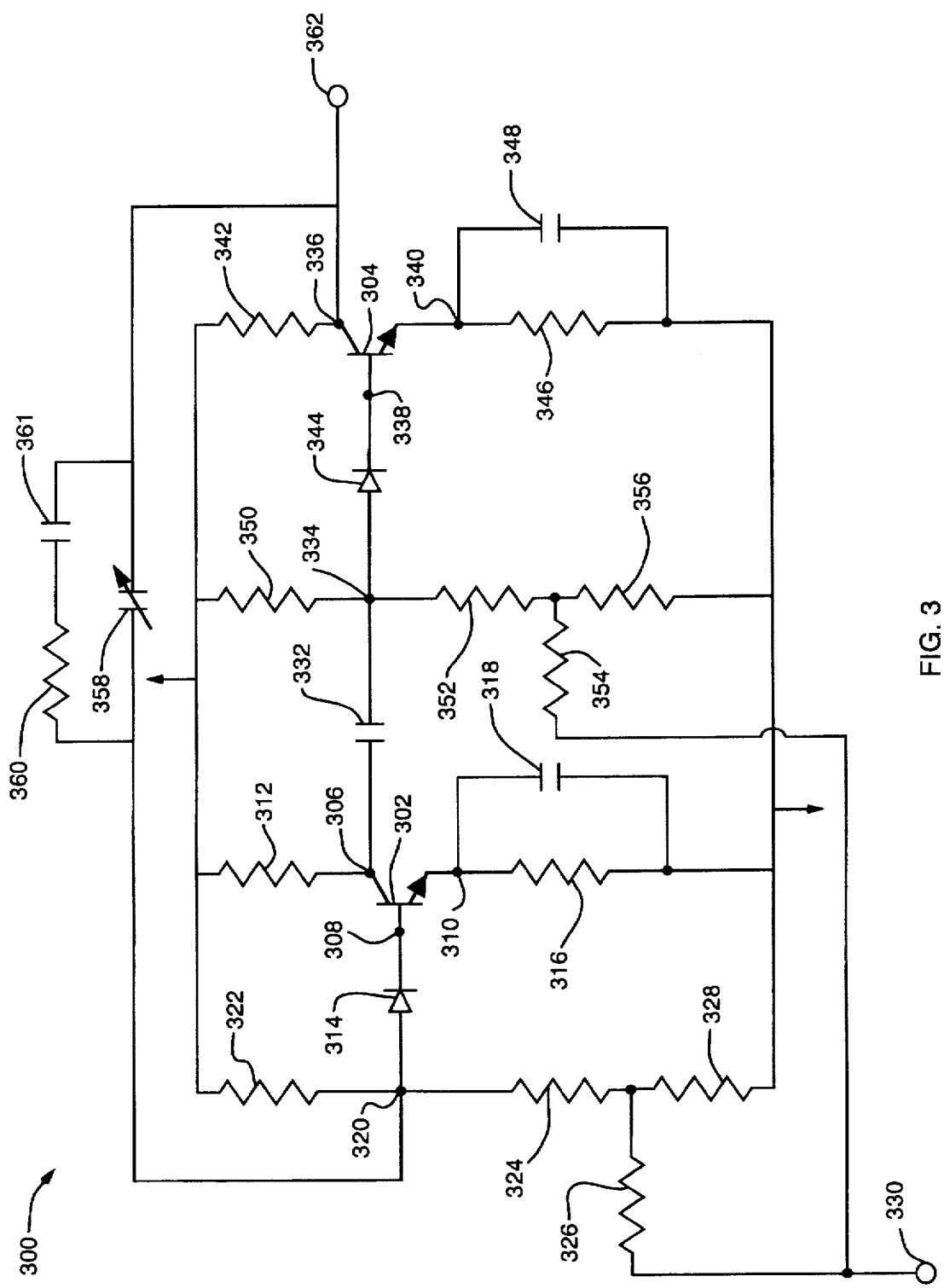
FIG. 3 shows an oscillator where effective resistors in the two stages of the oscillator of FIG. 2 include diodes for generating variable resistance.

FIG. 3 shows an alternative oscillating signal generator 300 where the control signal can vary $R_{eff}$ as well as $\omega_T$. The circuit elements in FIG. 3 that are similar to those in FIG. 2 serve the same function as the corresponding circuit element in FIG. 2. The oscillating signal generator 300 of FIG. 3, similarly to the oscillating signal generator 200 of FIG. 2, includes a first gain stage with a first BJT 302 and a second gain stage with a second BJT 304, and those gain stages are configured to the oscillation condition such that the oscillation frequency $\omega=[\omega_T/(R_{eff}C_E)]^{1/2}$.

However, in the oscillating signal generator 300 of FIG. 3, the base load resistors have been replaced with diodes. A first diode 314 is operatively connected between the first base terminal 308 of the first BJT 302 and the first stage input terminal 320. A second diode 344 is operatively connected between the second base terminal 338 of the second BJT 304 and the second stage input terminal 334. An example diode that is amenable for high frequency RF communications applications is the 1N914 from Motorola, Inc., Schaumberg, Ill.

The resistance across a diode is indirectly proportional to the current flowing through the diode. In the oscillating signal generator 300 of FIG. 3, the control signal on the control signal terminal 330 is a resistance control signal that determines the currents flowing through the first and second diodes 314 and 344 as well as the currents flowing through the first and second BJTs 302 and 304.

A variation in the current flowing through the diodes causes a corresponding variation in the respective resistance across the diodes. Thus, the control signal determines $R_{eff}$ as well as $\omega_T$ in the expression for the oscillation frequency $\omega=[\omega_T/(R_{eff}C_E)]^{1/2}$. Since the control signal can change both the $R_{eff}$ and $\omega_T$ variables, the VCO 300 of FIG. 3 can produce a wider range of oscillation frequencies.

Figure 4:
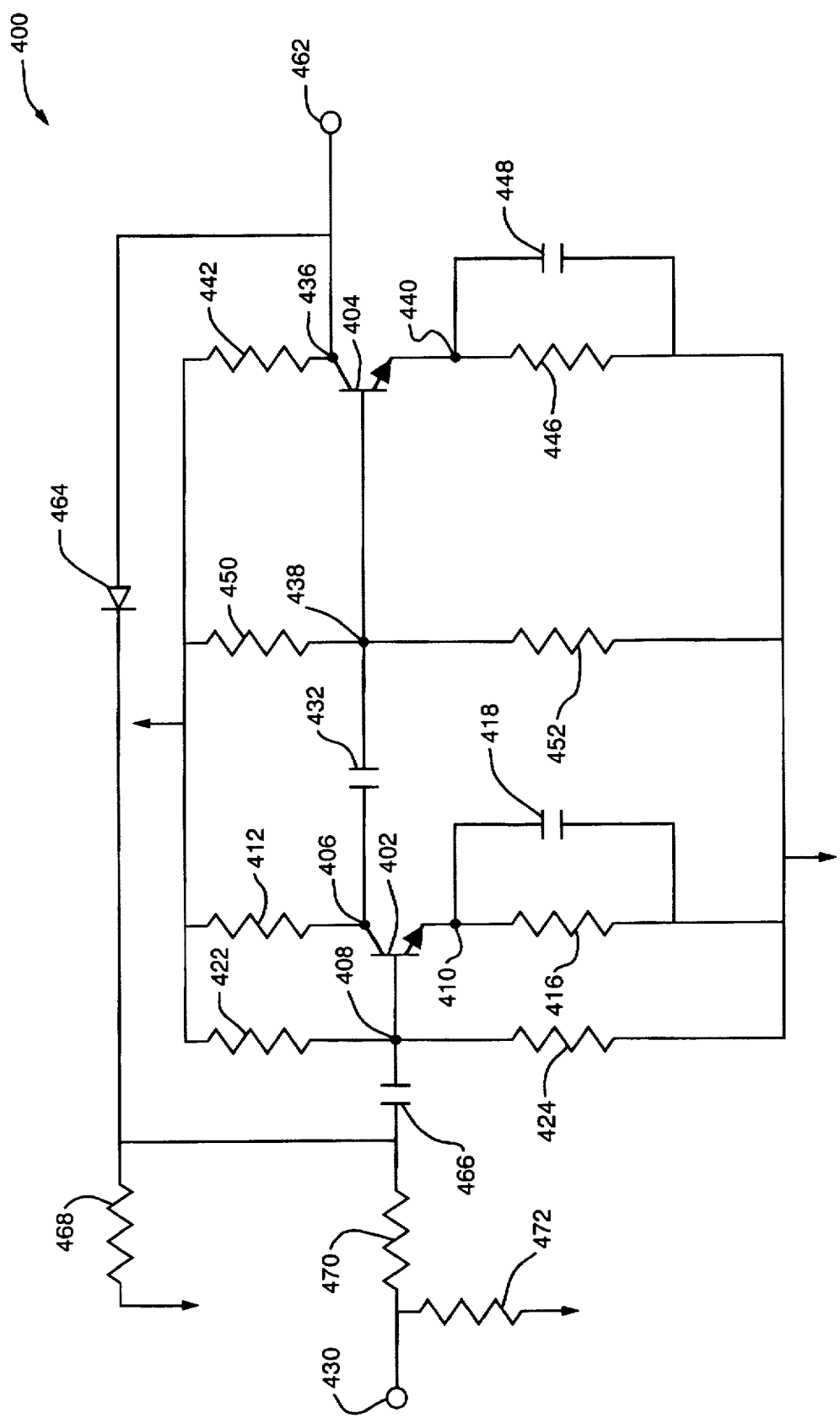
FIG. 4 shows an alternative embodiment of the present invention for varying an effective resistance of a diode for a corresponding variation in the oscillation frequency.

FIG. 4 shows an alternative oscillating signal generator 400 that also allows for a variation of the resistance across a diode for a corresponding variation in the oscillation frequency. The circuit elements in FIG. 4 that are similar to those in FIG. 3 serve the same function as the corresponding circuit elements in FIG. 3. The oscillating signal generator 400 similarly includes a first gain stage with a first BJT 402 and a second gain stage with a second BJT 404, and those gain stages are configured to the oscillation condition such that the oscillation frequency $\omega=[\omega_T/(R_{eff}C_E)]^{1/2}$.

However, in the oscillating signal generator 400 of FIG. 4, the diodes operatively connected at the base terminals of the first and second BJTs have been replaced by a feedback diode 464 operatively connected between the second stage output terminal 436 and to the first stage input terminal via an input coupling capacitor 466. A diode biasing resistor 468 is operatively connected to the feedback diode. The control signal at the control signal terminal 430 is operatively coupled to the first base terminal 408 via the input coupling capacitor, a first control signal bias resistor 470, and a second control signal bias resistor 472.

The oscillating signal generator 400 of FIG. 4 controls the oscillation frequency $\omega=[\omega_T/(R_{eff}C_E)]^{1/2}$ by varying the $\omega_T$ of the first BJT 402 and the effective resistance $R_{eff}$ generated partly by the diode 464 at the first base terminal 408 of that BJT. This oscillating signal generator is more advantageous than that of FIG. 3 because the current that can flow through the diode 464 is not a base current (in contrast to the diodes of the oscillating signal generator 300 of FIG. 3) and thus has a wider range of variation. In contrast, because the diodes that are used to provide a variable resistance in the oscillating signal generator 300 of FIG. 3 are determined by base currents, that resistance is limited since base currents tend to have small current values. Because of the wider range of currents flowing through diode 464, the oscillating signal generator 400 of FIG. 4 can provide a wider frequency range than the oscillating signal generator 300 of FIG. 3.

Figure 5:
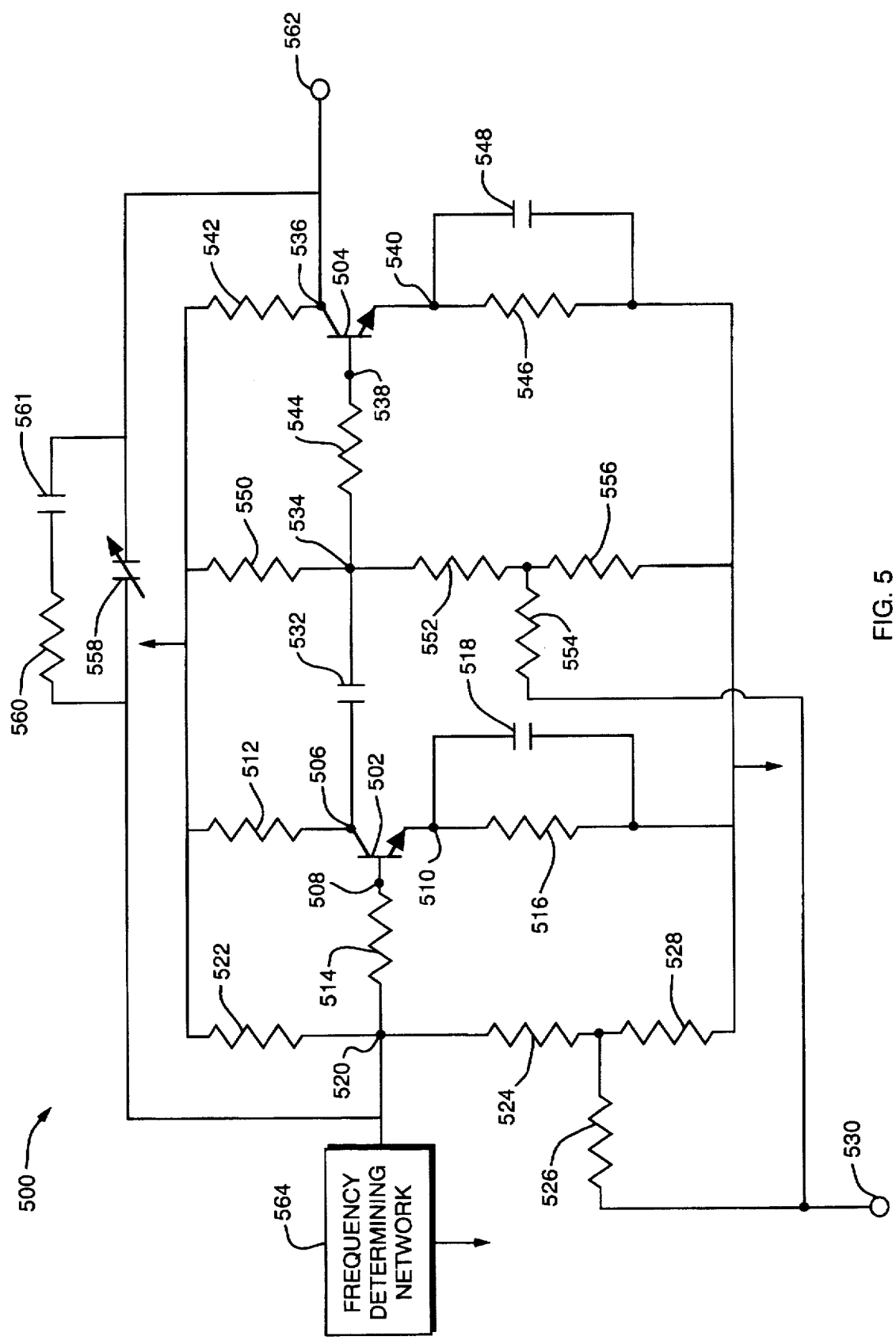
FIG. 5 shows an oscillator which includes a frequency determining network at the input of the oscillator of FIG. 2 for determining the oscillation frequency of that oscillator.

The oscillating signal generators of FIGS. 2–4 can produce a range of oscillation frequencies. FIG. 5 shows an oscillating signal generator 500 that can provide a oscillating signal with a predetermined fixed frequency for the oscillation frequency or a stable predetermined center frequency with capability for fine adjustment to the oscillation frequency. The circuit elements in FIG. 5 that are similar to those in FIG. 2 serve the same function as the corresponding circuit elements in FIG. 2. The oscillating signal generator 500 of FIG. 5, similarly to the oscillating signal generator 200 of FIG. 2, includes a first gain stage with a first BJT 502 and a second gain stage with a second BJT 504.

In contrast however to the VCO 200 of FIG. 2, the oscillating signal generator 500 of FIG. 5 also includes a frequency determining network 564. That frequency determining network may be a resonance structure such as a tank circuit or a ceramic, crystal, or dielectric resonator. A tank circuit which typically would include an inductive element can be implemented with a transmission-line reactive element since the oscillating signal generators of the present invention can operate at high frequencies (of at least 2 GHz). Such a network would determine a predetermined resonance frequency. If the control signal terminal 530 were tied to a predetermined potential such as ground, then the oscillating signal would have an oscillation frequency substantially fixed at the predetermined resonance frequency.

Alternatively, a control signal can be applied to the control signal terminal 530 to generate a deviation to the oscillation frequency from the predetermined resonance frequency. In this manner, the control signal can finely adjust the oscillation frequency from the predetermined resonance frequency. In addition, the control signal can be used to compensate for any deviations of the oscillation frequency from the predetermined frequency such that the oscillation frequency remains substantially fixed at the predetermined resonance frequency despite variations in the operating environment of the oscillating signal generator 500.

The advantages of the invention described herein can be generalized to implementation of the oscillating signal generator with any electronic gain device that can be easily fabricated on-chip and that has a gain characteristic with a unity gain frequency that can be determined by a control signal and/or with a resistor having a resistive value that can be determined by a control signal. Accordingly, the forgoing description is by way of example only and is not intended to be limiting. The invention is limited only as defined in the following claims and equivalents thereof.

What is claimed is:

1. A method for generating an oscillating signal having an oscillation frequency that varies with at least one of a control signal and a resistive value, the method including in combination, the steps of:

A. generating a first gain with a first phase at a first gain stage having a first stage input terminal, a first stage output terminal, a first gain device, and a first stage effective resistor operatively connected between said first stage input terminal and said first gain device and having a first resistive value, said first gain device having a first unity gain frequency responsive to said control signal;

B. setting said first phase at substantially 180° by canceling out, to substantially zero, a first real component of a first effective impedance at said first stage input terminal, such that said oscillation frequency is directly proportional to said first unity gain frequency and indirectly proportional to said first resistive value;

C. generating a second gain with a second phase at a second gain stage having a second stage input terminal operatively connected to said first stage output terminal, and having a second stage output terminal, a second gain device, and a second stage effective resistor operatively connected between said second stage input terminal and said second gain device and having a second resistive value, said second gain device having a second unity gain frequency responsive to said control signal;

D. setting said second phase at substantially 180° by canceling out, to substantially zero, a second stage real component of a second effective impedance at said second stage input terminal, such that said oscillation frequency is directly proportional to said second unity gain frequency and indirectly proportional to said second resistive value; and E. operatively connecting a feedback network, having a feedback gain, between said second stage output terminal and said first stage input terminal, wherein a product of said feedback gain, said first gain, and said second gain is substantially equal to one.

2. The method of claim 1 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

3. The method of claim 1 wherein, said oscillating signal is a sine wave.

4. The method of claim 1 wherein, said first resistive value and said second resistive value are both substantially equal to a third resistive value, and wherein said first unity gain frequency and said second unity gain frequency are both substantially equal to a third unity gain frequency, such that said oscillation frequency is directly proportional to said third unity gain frequency and indirectly proportional to said third resistive value.

5. The method of claim 4 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

6. The method of claim 1, further including in combination, the step of:

F. varying at least one of said first resistive value and said second resistive value by correspondingly varying a resistance control signal in order to correspondingly vary said oscillation frequency.

7. The method of claim 6 wherein, said first stage effective resistor includes a first diode such that said first resistive value is responsive to a first diode current flowing through said first diode and responsive to said resistance control signal, and wherein, said second stage effective resistor includes a second diode such that said second resistive value is responsive to a second diode current flowing through said second diode and responsive to said resistance control signal.

8. The method of claim 7 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

9. The method of claim 1, further including in combination, the steps of:

F. setting said control signal to a predetermined potential; and

G. operatively connecting a frequency determining network to said first stage input terminal, for determining a predetermined resonance frequency for said oscillation frequency.

10. The method of claim 9 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

11. The method of claim 1, further including in combination, the steps of:

F. operatively connecting a frequency determining network to said first stage input terminal, for determining a predetermined resonance frequency for said oscillation frequency; and G. setting said control signal to cause a deviation of said oscillation frequency from said predetermined resonance frequency.

12. The method of claim 11 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

13. An oscillating signal generator that generates an oscillating signal having an oscillation frequency that varies with at least one of a control signal and a resistive value, the oscillating signal generator comprising, in combination:

a first gain stage, having a first stage input terminal and a first stage output terminal, for generating a first gain with a first phase, said first gain stage including, in combination:

a first gain device having a first unity gain frequency responsive to said control signal;

a first stage effective resistor, operatively connected between said first stage input terminal and said first gain device, and having a first resistive value; and wherein said oscillation frequency is directly proportional to said first unity gain frequency and indirectly proportional to said first resistive value such that a first stage real component of a first effective impedance at said first stage input terminal is canceled to substantially zero and said first phase is substantially 180°;

a second gain stage, having a second stage input terminal, operatively connected to said first stage output terminal, and having a second stage output terminal, for generating a second gain with a second phase, said second gain stage including, in combination:

a second gain device having a second unity gain frequency responsive to said control signal;

a second stage effective resistor, operatively connected between said second stage input terminal and said second gain device, and having a second resistive value; and wherein, said oscillation frequency is directly proportional to said second unity gain frequency and indirectly proportional to said second resistive value such that a second stage real component of a second effective impedance at said second stage input terminal is canceled to substantially zero and said second phase is substantially 180°; and a feedback network, operatively connected between said second stage output terminal and said first stage input terminal, having a feedback gain wherein, a product of said feedback gain, said first gain, and said second gain is substantially equal to one.

14. The oscillating signal generator of claim 13 wherein,
said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

15. The oscillating signal generator of claim 13 wherein, said oscillating signal is a sine wave.

16. The oscillating signal generator of claim 13 wherein, said first resistive value and said second resistive value are both substantially equal to a third resistive value, and wherein said first unity gain frequency and said second unity gain frequency are both substantially equal to a third unity gain frequency, such that said oscillation frequency is directly proportional to said third unity gain frequency and indirectly proportional to said third resistive value.

17. The oscillating signal generator of claim 16 wherein,
said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

18. The oscillating signal generator of claim 13 wherein, said first stage effective resistor includes a first diode such that said first resistive value is responsive to a first diode current flowing through said first diode and responsive to a resistance control signal.

19. The oscillating signal generator of claim 18 wherein, said second stage effective resistor includes a second diode such that said second resistive value is responsive to a second diode current flowing through said second diode and responsive to said resistance control signal.

20. The oscillating signal generator of claim 19 wherein,
said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

21. The oscillating signal generator of claim 13 wherein, said control signal is set to a predetermined potential and wherein the oscillating signal generator further comprises, in combination:

a frequency determining network operatively connected to said first stage input terminal and having a predetermined resonance frequency, that sets said oscillation frequency at said predetermined resonance frequency.

22. The oscillating signal generator of claim 21 wherein,
said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

23. The oscillating signal generator of claim 13, further comprising, in combination:

a frequency determining network, operatively connected to said first stage input terminal and having a predetermined resonance frequency, that sets said oscillation frequency at said predetermined resonance frequency, and wherein, said control signal is varied to cause a corresponding deviation of said oscillation frequency from said predetermined resonance frequency.

24. The oscillating signal generator of claim 23 wherein, said first gain device is a first bipolar junction transistor having said first unity gain frequency for a first transistor current gain frequency characteristic that is determined by a first transistor current flowing through said first bipolar junction transistor and responsive to said control signal, and wherein, said first stage input terminal is operatively connected via said first stage effective resistor to a first base terminal of said first bipolar junction transistor and said first stage output terminal is operatively connected to a first collector terminal of said first bipolar junction transistor, and wherein, said second gain device is a second bipolar junction transistor having said second unity gain frequency for a second transistor current gain frequency characteristic that is determined by a second transistor current flowing through said second bipolar junction transistor and responsive to said control signal, and wherein, said second stage input terminal is operatively connected via said second stage effective resistor to a second base terminal of said second bipolar junction transistor and said second stage output terminal is operatively connected to a second collector terminal of said second bipolar junction transistor.

25. An oscillating signal generator that generates an oscillating signal having an oscillation frequency that varies with at least one of a control signal and a resistive value, the oscillating signal generator comprising, in combination:

means for generating a first gain with a first phase, wherein said oscillation frequency is directly proportional to a first unity gain frequency responsive to said control signal, and indirectly proportional to a first resistive value, such that said first phase is substantially 180°;

means for generating a second gain with a second phase, wherein said oscillation frequency is directly proportional to a second unity gain frequency responsive to said control signal, and indirectly proportional to a second resistive value, such that said second phase is substantially 180°, and wherein, said means for generating said first gain is cascaded to said means for generating said second gain; and means for feeding-back from an output of said means for generating said second gain to an input of said means for generating said first gain, with a feedback gain wherein, a product of said feedback gain, said first gain, and said second gain is substantially equal to one.

26. The oscillating signal generator of claim 25 wherein, said oscillating signal is a sine wave.

27. The oscillating signal generator of claim 25, further comprising, in combination:

means for varying at least one of said first resistive value and said second resistive value with a resistance control signal.

28. The oscillating signal generator of claim 25, further comprising, in combination:

means for setting said oscillation frequency to a predetermined resonance frequency.

29. The oscillating signal generator of claim 28, further comprising, in combination:

means for generating a deviation from said predetermined resonance frequency for said oscillation frequency.

* * * * *